(12) United States Patent
Shell

(10) Patent No.: US 7,202,657 B2
(45) Date of Patent: Apr. 10, 2007

(54) MANUAL ACTUATOR FOR LOADING LEADLESS MICROCIRCUIT PACKAGES IN A CIRCUIT TESTER

(75) Inventor: Dennis B. Shell, Webster, MN (US)

(73) Assignee: JohnsTech International Corporation, Minneapolis, MN (US)

( * ) Notice: Subject to any disclaimer, the term of this patent is extended or adjusted under 35 U.S.C. 154(b) by 21 days.

(21) Appl. No.: 11/254,511

(22) Filed: Oct. 20, 2005

(65) Prior Publication Data

US 2006/0087311 A1 Apr. 27, 2006

Related U.S. Application Data

(60) Provisional application No. 60/620,880, filed on Oct. 21, 2004.

(51) Int. Cl.
*G01R 31/02* (2006.01)
(52) U.S. Cl. .................................................. 324/158.1
(58) Field of Classification Search ........ 324/754–765, 324/158.1; 439/66–72; 269/25
See application file for complete search history.

(56) References Cited

U.S. PATENT DOCUMENTS 4,563,810 A * 1/1986 Adlon et al. ................. 29/749
6,617,867 B2 * 9/2003 Bruno et al. ................ 324/758
2006/0163789 A1 * 7/2006 Chiu .......................... 269/25

* cited by examiner

Primary Examiner—Vinh P. Nguyen
(74) Attorney, Agent, or Firm—Nawrocki, Rooney & Sivertson, P.A.

(57) ABSTRACT

An actuator for pressing a plurality of circuit contacts carried on a microcircuit package against a plurality of test contacts has a frame having a top surface and a bottom surface facing away from the top surface. The frame has first and second end slots each intersecting the top surface at opposite ends thereof. A loader foot is carried by the frame's bottom surface for applying force to a microcircuit. First and second latch elements, each respectively mounted within the frame's first and second end slots are each shiftable between a latched position and an unlatched position within the frame's first and second slots, each said latch element when in the latched position for gripping an edge of an alignment plate and when in the unlatched position for releasing the alignment plate. An actuator element mounted on the frame's top surface receives manual force and converts the received manual force to force applied to the latch elements to shift the latch elements between the latched and unlatched positions.

12 Claims, 2 Drawing Sheets

MANUAL ACTUATOR FOR LOADING LEADLESS MICROCIRCUIT PACKAGES IN A CIRCUIT TESTER

CROSS-REFERENCE TO RELATED APPLICATIONS

This is a regular application filed under 35 U.S.C. § 111(a) claiming priority, under 35 U.S.C. § 119(e)(1), of provisional application Ser. No. 60/620,880, filed Oct. 21, 2004.

BACKGROUND OF THE INVENTION

Microcircuits are well known electrical components that combine hundreds or thousands of individual circuit components and connections in a small volume. The package that holds a typical microcircuit may be no larger than 10 mm. square by 1 mm. thick. One common type of container for a microcircuit called a leadless package, has small connector or contact pads along the periphery of one surface of the package. A single package may have several dozen contact pads by which power is supplied to the microcircuits and signals sent to and from the microcircuit. The contact pads are soldered onto the conductors of a circuit board during assembly of the electrical device.

Before a microcircuit is soldered onto a circuit board, the microcircuit must be tested to assure design functionality. Soldering a defective microcircuit onto a circuit board often ruins the entire board, since typically it is either not possible or not economic to remove a defective microcircuit from a circuit board. Since typical microcircuits are the result of a complex manufacturing process, testing is essential to assure that every microcircuit is completely functional.

For a number of reasons, testing these microcircuits is complex. In the first place, one should not solder the microcircuits to be tested into the test fixture because the act of removing the microcircuits when testing is complete might itself damage the microcircuit.

Secondly, the microcircuits are small and the contacts are closely spaced, on perhaps as small as a 0.3 mm pitch. The contacts themselves may be as small as 0.15 mm wide. For accurate testing, the test fixture contacts must make reliable, low-resistance contact with each of the microcircuit contacts during the entire test process, which may extend to even many hours. Failure to make proper contact with each microcircuit contact for the entire test sequence results in a test that incorrectly fails the microcircuit.

While it is important to test each microcircuit thoroughly, it is also important to test them quickly and cheaply. Accordingly, automated testers have been developed that operate with little human intervention to reliably test hundreds or thousands of individual microcircuits per hour.

A typical tester has its own circuit board with one or more arrays of test contacts that are spaced and aligned to make temporary mechanical contact with the connector pads on the microcircuit package. Each test socket contact is designed to resiliently deflect a very small amount when force is applied. This accommodates any dimensional variations in either the microcircuit package or the test socket contacts.

An alignment plate is mounted on the tester circuit board with an aperture that receives and precisely positions each microcircuit to be tested so that each of the microcircuit contact pads is in precise alignment with the corresponding test contact. The alignment plate is typically bolted to the contactor which is mounted to tester circuit board.

To assure reliable and low resistance electrical conduction between each test socket contact and the corresponding microcircuit contact, the tester includes a presser or loader element that applies sufficient force to the microcircuit package so that each of the microcircuit package contacts at least slightly deflects the corresponding test socket contact. For example, if the test procedure requires 50 grams of force between each package contact and each tester contact, a package with 100 contacts will then require 5 kg. of force for proper electrical connection between each of the microcircuit contacts and the corresponding tester contact. It is not at all convenient to manually apply such a force for the entire duration of a longer test.

Two temporary situations arise where automated force application to the microcircuit during testing is not convenient. One of these situations is where a tester fails more than the expected percentage of microcircuits, or where the tester is inconsistent in testing the same microcircuit. In either case the tester itself must be tested or repaired.

The second situation is when a tester is being first set up for testing a particular microcircuit. During either of these situations, it is necessary for the entire duration of the test to consistently apply the appropriate force to the package to create the required force between the microcircuit contacts and the tester contacts. We find in these circumstances that using the tester loader element is inconvenient and applying force by hand to the package insufficiently precise and very difficult.

Accordingly, a mechanism for temporarily applying a consistent force to press a microcircuit against tester contacts allows an operator to more efficiently deal with each of these two situations.

SUMMARY OF THE INVENTION

An actuator for pressing a plurality of circuit contacts carried on a microcircuit package against a plurality of test contacts operates with manual force and interfaces with the alignment plate found on most microcircuit testing units.

This actuator includes a frame having a generally rhomboidal exterior shape. The frame has a top surface, and a bottom surface facing away from the top surface. The frame has first and second end features which in one embodiment comprise slots. The end features intersect the top surface at opposite ends thereof.

The frame's bottom surface carries a loader foot for applying force to a microcircuit package.

First and second latch elements are each respectively mounted within the frame's first and second end features. Each latch element is shiftable between a latched position and an unlatched position within the frame's first and second end features. Each latch element when in the latched position can engage and grip an edge of an alignment plate. When in the unlatched position, each latch element releases the alignment plate.

An actuating element is mounted on the frame's top surface for receiving manual force from an operator. The actuating element converts the received manual force to force applied to the latch elements to shift the latch elements between the latched and unlatched positions.

DETAILED DESCRIPTION OF THE INVENTION

Figure 1:
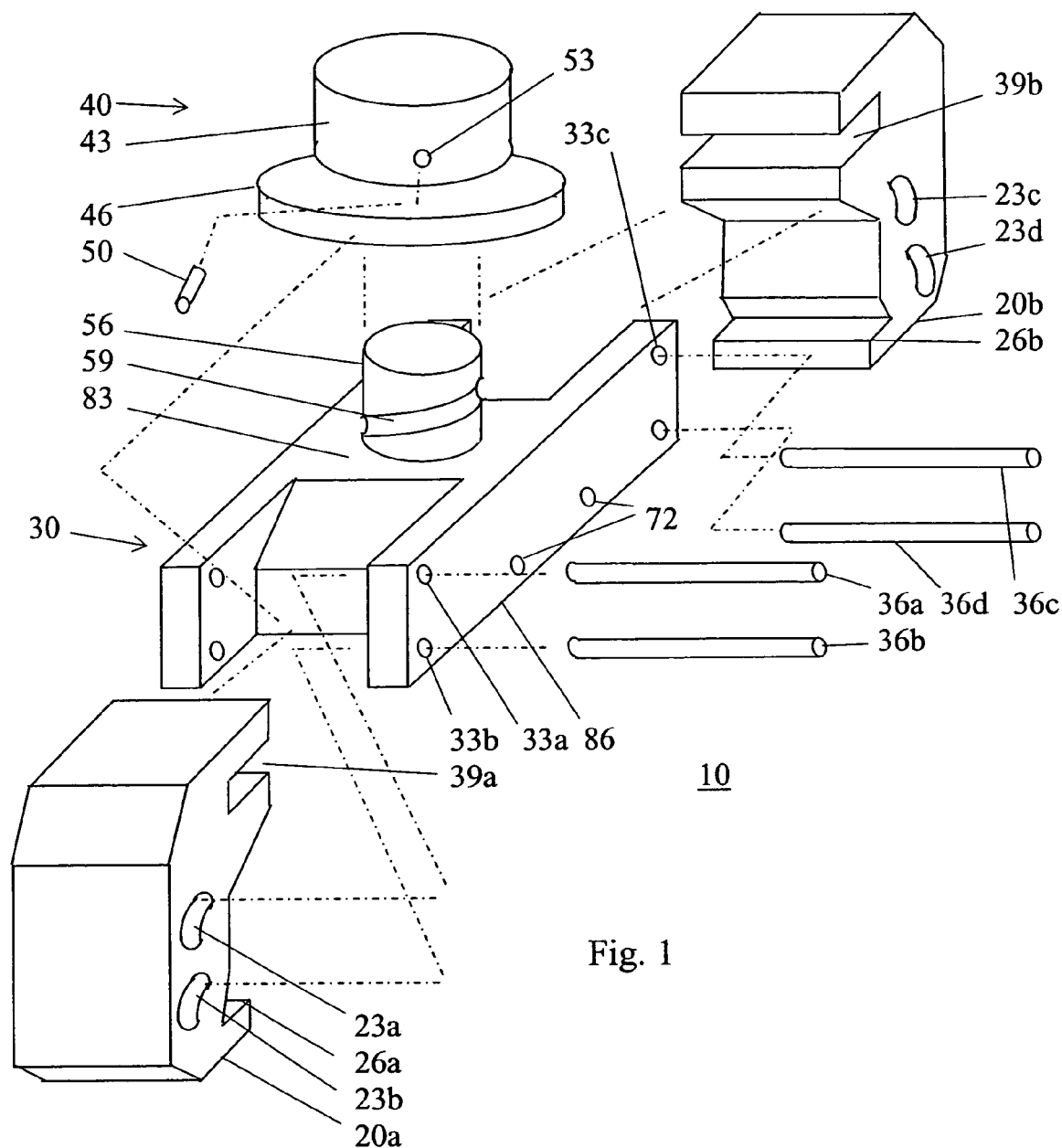
FIG. 1 shows an exploded view of a mechanical actuator for temporarily applying force to a microcircuit package to seat the package while the package is positioned for testing in a tester.
Figure 2:
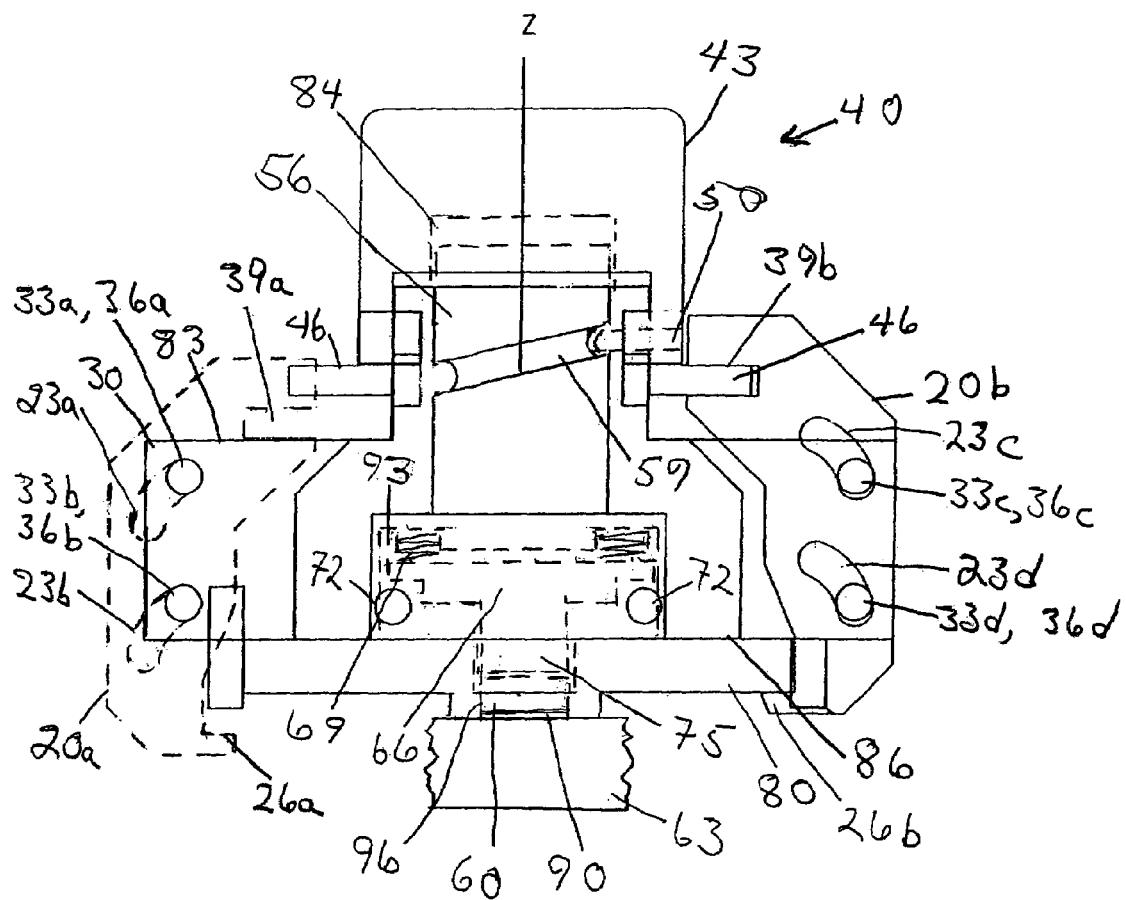
FIG. 2 is a side elevation view of the mechanical actuator as may be typically mounted on a tester circuit board.

The mechanical actuator 10 for use with an automated microcircuit tester system is shown in FIGS. 1 and 2. The exploded view of FIG. 1 is helpful in understanding the structure and operation of actuator 10. The dashed lines indicate how the various components fit together and interact.

Actuator 10 provides temporary seating force to press a microcircuit package 60 against a tester circuit board 63, both shown in FIG. 2. Tester circuit board 63 includes tester contacts generally shown at 90 in FIG. 2, that compliantly press against the contacts, shown in edge view in FIG. 2, of microcircuit package 60. Refer to the Background section for a sense of the relatively small size of package 60.

Actuator 10 includes an elongate frame 30 that supports the various actuator 10 components. As shown in FIG. 1, frame 30 has a general H shape with end features comprising a slot at each end, but as will be explained, other shapes may be suitable for frame 30. For convenience, the surface 83 in FIG. 1 will be referred to as the upper or top surface and the surface 86 shown as edges in FIGS. 1 and 2 will be referred to as the bottom or lower surface.

Upper surface 83 includes an integral hub or spindle 56 having a circular cross section, and having on the exterior thereof, an inclined groove 59. A knob 40 comprising an actuating element has a bore 84 (see FIG. 2) designed to mate with hub 56 so that knob 40 can rotate on hub 56.

Knob 40 includes a grip 43 with which the user applies torque to knob 40. Knob 40 further includes an annular disc 46 axially aligned with the opening of bore 84. Disc 46 engages slots 39a and 39b in a respective pair of latch elements 20a and 20b. Latch elements 20a and 20b may have identical shapes.

Knob 40, hub 56 and backing plate 66, it will be understood, can have aligned, coaxial bores (not shown) formed therein. Said bores can function to permit passage of heating or cooling air therethrough.

Latch elements 20a and 20b are clamping elements that clamp actuator 10 to an alignment board or plate 80 shown on edge in FIG. 2, and which forms a part of a tester system. Alignment plate 80 includes an alignment aperture 96 for properly positioning the microcircuits 60 for testing, see the Background discussion. Latch elements 20a and 20b can have a number of different shapes that may interact with differently shaped frames 30 to provide the intended functionality.

Latches 20a and 20b have on their upper ends, projections with slots 39a and 39b respectively. The vertical (as shown in FIGS. 1 and 2) widths of slots 39a and 39b are sufficient to allow entry therein for the periphery of flange 46. Latch elements 20a and 20b also have at the bottom ends thereof, jaws 26a and 26b respectively. Thus, the projections having slots 39a and 39b form first or top ends of latch elements 20a and 20b, and jaws 26a and 26b form second or bottom ends of latch elements 20a and 20b.

In the particular design shown, each latch element 20a and 20b includes a pair of identically shaped positioning slots 23a and 23b (latch 20a) and slots 23c and 23d (latch 23b). Slots 23a and 23b each slope downwardly from slot 39a and away from jaw 26a. Slots 23c and 23d each slope downwardly from slot 39b and away from jaw 26b. While slots 23a–23d are shown as curved, slots 23a–23d that are not curved are likely to also provide the desired functionality.

The width of the slot or opening at each end of frame 30 is sized to accept a latch element 20a or 20b. Latch elements 20a and 20b are retained in the frame 30 slots by guide pins 36a and 36b that pass through slots 23a and 23b respectively and pins 36c and 36d that pass through slots 23c and 23d respectively. Pins 36a–36d are retained in frame 30 by pressure or interfering fits in holes 33a–33d, or other well-know retention means.

The diameters of pins 36a–36d are slightly smaller than the widths of slots 23a–23d to allow latch elements 20a and 20b to slide along a predetermined path from an unattached or unlatched position as shown by the phantom image of latch element 20a in FIG. 2 to a latched position as shown by latch element 20b in FIG. 2. In the unlatched position, latch elements 20a and 20b are positioned downwards and outward with respect to microcircuit 60, and compared to the latched position shown by latch element 20b in FIG. 2. In the unlatched position, actuator 10 can be removed from or positioned on alignment plate 80.

The latched position shown by latch element 20b in FIG. 2 clamps actuator 10 to alignment plate 80. In the latched position, latch elements 20a and 20b are positioned upwards and inwards compared to the unlatched position shown by latch element 20b in FIG. 2. In this position, jaws 26a and 26b engage edges of alignment plate 80 firmly and positively clamp actuator 10 to alignment plate 80.

Slots 23a and 23b and slots 23c and 23d define the path and orientation that latch elements 20a and 20b follow while shifting between the latched and unlatched positions. When latch elements 20a and 20b are shifting from the unlatched to the latched position, the angled orientation of slots 23a–23d causes an upward and inward (towards microcircuit 60) movement of jaws 26a and 26b to engage the edges of alignment plate 80. When latch elements 20a and 20b are shifting from the latched to the unlatched position, the angled orientation of slots 23a–23d causes a downward and outward (away from microcircuit 60) movement of jaws 26a and 26b to disengage from the edges of alignment plate 80. In the unlatched position, the distance between jaws 26a and 26b is sufficient to clear the edges of alignment plate 80 and allow actuator 10 to be removed from the alignment plate 80.

Knob 40 is a force-generating element that converts manual force applied to knob 40 to vertical force applied to latch elements 20a and 20b to shift latch elements 20a and 20b between the latched and unlatched positions, and control the position of jaws 26a and 26b. As mentioned earlier, knob 40 rotates on a hub 56 having a diagonal slot 59. A pin 50 pressed into a hole 53 in grip 43 and protrudes into slot 59. Pin 50 is held in place by an interference fit in hole 53. A second diagonal slot with a second pin may be added to reduce binding of knob 40 on hub 56. Such a slot is best placed on hub 56 in diametric opposition to slot 59 shown.

Disc 46 fits within slots 39a and 39b. One can see that turning knob 43 causes a camming action between pin 50 and slot 59. The camming action causes knob to 40 transition between a latched position with knob 40 spaced from upper surface 83 and an unlatched position where knob 40 is very close to or even touching upper surface 83. The vertical shifting of knob 40 when rotated, forces latch elements 20a and 20b into the corresponding latched and unlatched positions.

Turning now to FIG. 2 only, a loader foot 75 aligned with alignment aperture 96 transmits force from frame 30 and latch elements 20*a* and 20*b* to microcircuit 60. Loader foot 75 is integral with a backing plate 66, which can shift vertically within a load chamber 93 within frame 30. Load chamber 93 opens downwardly in lower surface 86 between jaws 26*a* and 26*b*. Load springs 69 urge loader foot 75 toward microcircuit 60 when actuator 10 is operated into the latched position from the unlatched position. Backing plate 66 is held in load chamber 93 by retainer pins 72.

Springs 69 should have a high enough spring rate to collectively assure that the force applied by loader foot 75 to microcircuit 60 is sufficient to induce the desired level of 50–70 gm of force per microcircuit 60 contact and its associated tester contact. As a practical matter, a millimeter or two of vertical travel for backing plate 66 is sufficient to assure that all of the microcircuit 60 contacts are properly loaded when actuator 10 is in the latched position.

Other than for the pins 39*a*–39*d*, 50, and 72 and the springs 69, all of which may be made from steel, the remaining parts of actuator 10 may comprise a thermoplastic resin such as amorphous thermoplastic polyetherimide. Other strong plastics with low friction characteristics may also be used.

A further exception in this regard is to make loader foot 75 from a good thermal conductor such as aluminum or copper to provide heat sinking for microcircuit 60. Where microcircuit 60 is of the type that generates substantial heat or where the testing process extends for a long time, heat sinking for microcircuit package 60 is advantageous.

A number of different mechanisms can be employed to control the transition of latch elements 20*a* and 20*b* between the latched and unlatched positions. A number of components different from knob 40 can be used as the actuating element to generate force applied to the latch elements 20*a* and 20*b*.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. An actuator for pressing a plurality of circuit contacts carried on a microcircuit package against a plurality of test contacts, said actuator including
   a) a frame having a generally rhomboidal exterior shape, said frame having a top surface, and a bottom surface facing away from the top surface, said frame having first and second end features each intersecting the top surface at opposite ends thereof;
   b) a loader foot carried by the frame's bottom surface for applying force to a microcircuit;
   c) first and second latch elements, each respectively mounted within the frame's first and second end features and each shiftable between a latched position and an unlatched position within the frame's first and second features, each said latch element when in the latched position for gripping an edge of an alignment plate and when in the unlatched position for releasing the alignment plate; and
   d) an actuating element mounted on the frame's top surface for receiving manual force and for converting the received manual force to force applied to the latch elements to shift the latch elements between the latched and unlatched positions.

2. The actuator of claim 1, wherein the actuating element comprises a hub carried on the upper surface of the frame and a rotatable knob with a bore mated to the hub, said knob mechanically interfacing with the latch elements.

3. The actuator of claim 2, wherein the latch elements include slots facing the knob, and wherein the knob includes an annular disc in axial alignment with the knob's bore, said disc engaged with the latch element slots.

4. The actuator of claim 1, wherein at least the first latch element includes at least one slot, and wherein the frame includes a guide pin passing through the slot and in cooperation with the actuating element, controlling the positioning of the first latch element in at least the latched position.

5. The actuator of claim 4, wherein the first latch element includes two slots, and wherein the frame includes two guide pins passing through the two slots in the first latch element.

6. The actuator of claim 5, wherein the slots in the first latch element are curved.

7. The actuator of claim 5, wherein the actuating element comprises a hub carried on the upper surface of the frame and a rotatable knob with a bore mated to the hub, said knob mechanically interfacing with the latch elements.

8. The actuator of claim 7, wherein the latch elements include slots facing the knob, and wherein the knob includes an annular disc in axial alignment with the knob's bore, said disc engaged with the latch element slots.

9. The actuator of claim 8, wherein the loader foot includes a spring providing compliant force to the microcircuit.

10. The actuator of claim 1, wherein the loader foot includes a spring providing compliant force to the microcircuit.

11. The actuator of claim 1, wherein the loader foot is formed at least in part from a good thermal conductor.

12. The actuator of claim 1, wherein the end features of the frame comprise slots.

* * * * *